United States Patent
Hahn et al.

(10) Patent No.: US 7,482,181 B2
(45) Date of Patent: Jan. 27, 2009

(54) METHOD FOR FABRICATING A LIGHT-EMITTING DEVICE BASED ON A GALLIUM NITRIDE-BASED COMPOUND SEMICONDUCTOR, AND LIGHT-EMITTING DEVICE BASED ON A GALLIUM NITRIDE-BASED COMPOUND SEMICONDUCTOR

(75) Inventors: Berthold Hahn, Hemau (DE); Andreas Hangleiter, Braunschweig (DE); Volker Härle, Waldetzenberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/762,097

(22) Filed: Jan. 20, 2004

(65) Prior Publication Data
US 2004/0152226 A1 Aug. 5, 2004

Related U.S. Application Data

(63) Continuation of application No. PCT/DE02/02677, filed on Jul. 19, 2002.

(30) Foreign Application Priority Data
Jul. 19, 2001 (DE) ................ 101 35 189

(51) Int. Cl.
*H01L 21/00* (2006.01)
(52) U.S. Cl. ................ 438/22; 438/42; 438/46; 438/47
(58) Field of Classification Search ............ 438/46, 438/47, 42, 22
See application file for complete search history.

(56) References Cited

U.S. PATENT DOCUMENTS 6,015,979 A 1/2000 Sugiura et al.

(Continued)

FOREIGN PATENT DOCUMENTS

EP 0 599 224 A1 6/1994

(Continued)

OTHER PUBLICATIONS

Kim, I.-H. et al.: "Formation of V-Shaped Pits in InGaN/GaN Multiquantum Wells and Bulk InGaN Films", Applied Physics Letters, vol. 73, No. 12, Sep. 21, 1998, pp. 1634-1636.

(Continued)

*Primary Examiner*—Michael Trinh
(74) *Attorney, Agent, or Firm*—Cohen Pontani Lieberman & Pavane LLP

(57) ABSTRACT

A light-emitting device is based on a gallium nitride-based compound semiconductor. A light-emitting layer with a first and a second main surface is formed from a compound semiconductor based on gallium nitride. A first coating layer, which is joined to the first main surface of the light-emitting layer, is formed from an n-type compound semiconductor based on gallium nitride. The composition of which differs from that of the compound semiconductor of the light-emitting layer. A second coating layer, which is joined to the second main surface of the light-emitting layer, is formed from a p-type compound semiconductor based on gallium nitride, the composition of which differs from that of the compound semiconductor of the light-emitting layer. To improve the light yield of the device, the thickness of the light-emitting layer in the vicinity of dislocations is configured to be lower than in the remaining regions.

18 Claims, 1 Drawing Sheet

U.S. PATENT DOCUMENTS

| | | | |
|---|---|---|---|
| 6,537,839 B2 * | 3/2003 | Ota et al. | 438/22 |
| 6,542,526 B1 | 4/2003 | Niwa et al. | |
| 6,555,846 B1 * | 4/2003 | Watanabe et al. | 257/94 |
| 6,815,726 B2 * | 11/2004 | Ishida et al. | 257/94 |

FOREIGN PATENT DOCUMENTS

| | | |
|---|---|---|
| EP | 0 599 224 B1 | 6/1994 |
| EP | 0 732 754 A2 | 9/1996 |
| EP | 0 933 048 A2 | 4/2000 |
| JP | 10-173284 | 6/1998 |
| JP | 2000-21789 | 1/2000 |

OTHER PUBLICATIONS

Chen, Y. et al.: "Pit Formation GaInN Quantum Wells", Applied Physics Letters, vol. 72, No. 6, Feb. 9, 1998, pp. 710-712.

Wu, X. H. et al.: "Dislocation Generation in GaN Heteroepitaxy", Journal of Crystal Growth, Elsevier Science B.V., 189/190, 1998, pp. 231-243.

Kawaguchi, Y. et al.: "The Formation of Crystalline Defects and Crystal Growth Mechanism in $In_xGa_{1-x}N$/GaN Heterostructure Grown by Metalorganic Vapor Phase Epitaxy", Journal of Crystal Growth, Elsevier Science B.V., 189/190, 1998, pp. 24-28.

Gallart, M. et al.: "CW and Time-Resolved Optical Spectroscopy of GaN Epilayers and GaN-AlGaN Quantum Wells Grown on A-Plane Sapphire", Phys.Stat.Sol., (b), 216, 365, 1999, pp. 365-369.

Keller, S. et al.: "Spiral Growth of InGaN Nanoscale Islands on GaN", Japanese Journal of Applied Physics, vol. 37, Part 2, No. 4B, Apr. 15, 1998, pp. L431-L434.

Hangleiter, A. et al.: "Optical Absorption and Excitation Spectroscopy on GaInN/GaN Double Heterostructures and Quantum Wells", Materials Science Forum, Trans Tech Publications, Switzerland, vols. 267-268, 1998, pp. 1287-1290.

Im, J. S. et al.: "Reduction of Oscillator Strength due to Piezoelectric Fields in GaN/$Al_xGa_{1-x}N$ Quantum Wells", The American Physical Society, Physical Review B, vol. 57, No. 16, Apr. 15, 1998, pp. R9435-R9438.

Nakamura, S. et al.: "High-Power InGaN Single-Quantum-Well-Structure Blue and Violet Light-Emitting Diodes", American Institute of Physics, Appl. Phys. Lett. 67, (13), Sep. 25, 1995, pp. 1868-1870.

Mukai, T.: "InGaN-Based Blue Light-Emitting Diodes Grown on Epitaxially Laterally Overgrown GaN Substrates", Publication Board, Japanese Journal of Applied Physics, vol. 37, Part 2, No. 7B, Jul. 15, 1998, pp. L839-L841.

Lester, S. D. et al.: "High Dislocation Densities in High Efficiency GaN-Based Light-Emitting Diodes", American Institute of Physics, Appl. Phys. Lett., vol. 66, No. 10, Mar. 6, 1995, pp. 1249-1251.

* cited by examiner

METHOD FOR FABRICATING A LIGHT-EMITTING DEVICE BASED ON A GALLIUM NITRIDE-BASED COMPOUND SEMICONDUCTOR, AND LIGHT-EMITTING DEVICE BASED ON A GALLIUM NITRIDE-BASED COMPOUND SEMICONDUCTOR

CROSS-REFERENCE TO RELATED APPLICATION

This application is a continuation of copending International Application No. PCT/DE02/02677, filed Jul. 19, 2002, which designated the United States.

BACKGROUND OF THE INVENTION

Field of the Invention

The present invention relates to a method for fabricating a light-emitting device based on a gallium nitride-based compound semiconductor and to a light-emitting device based on a gallium nitride-based compound semiconductor.

In the following context, the term light-emitting devices or layers also encompasses devices or layers which emit only or partially UV radiation or IR radiation.

Compound semiconductors based on gallium nitride—these are III-V compound semiconductors, which, inter alia, contain Ga and N, such as for example gallium nitride (GaN), gallium aluminum nitride (GaAlN), indium gallium nitride (InGaN) and indium aluminum gallium nitride (InAlGaN)—have a direct band gap in the range from 1.95 to 6 eV and are therefore eminently suitable for light-emitting devices, such as for example light-emitting diodes or laser diodes.

A light-emitting device based on a gallium nitride-based compound semiconductor is present in the context of the present invention as soon as a light-emitting structure of the device contains at least one layer of a compound semiconductor based on gallium nitride.

It has been established that light-emitting diodes which radiate light in the green (500 nm), blue (450 nm) or violet (405 nm) spectral region within a relatively narrow wavelength range (i.e. with a relatively small FWHM) with a very high light yield can be fabricated, for example, using an active, i.e. light-emitting layer in the form of one or more so-called quantum films made from InGaN. Light-emitting diodes of this type are built up, for example, by metal organic chemical vapor deposition (MOCVD) of a GaN buffer layer, a silicon-doped GaN layer, a silicon-doped AlGaN layer, a first coating layer of silicon-doped InGaN, the active, for example undoped InGaN layer, a second coating layer of magnesium-doped AlGaN and a magnesium-doped GaN layer. For blue light-emitting diodes, the active layer selected is, for example, $In_{0.2}Ga_{0.8}N$, and for violet light-emitting diodes, the active layer selected is, for example, $In_{0.09}Ga_{0.9}N$. A light-emitting device of this type is described, for example, in the reference by S. Nakamura et al., titled "High-Power InGaN Single-Quantum-Well-Structure Blue and Violet Light-Emitting Diodes", Appl. Phys. Lett. 67 (1995), pages 1868-1870.

Furthermore, European Patent EP 0 599 224 B1 discloses a light-emitting device. The light-emitting diode is based on a gallium nitride-based compound semiconductor having a double heterostructure. The diode is formed from a light-emitting layer having a first and a second main surface, formed from a $In_xGa_{1-x}N$ compound semiconductor where $0<x<1$. A first coating layer is joined to the first main surface of the light-emitting layer and is formed from an n-type compound semiconductor based on gallium nitride, the composition of which differs from that of the compound semiconductor of the light-emitting layer. A second coating layer is joined to the second main surface of the light-emitting layer and is formed from a p-type compound semiconductor based on gallium nitride, the composition of which differs from that of the compound semiconductor of the light-emitting layer. To improve the luminance or the light emission output power, the light-emitting layer is doped with a p-type foreign substance and/or an n-type foreign substance.

SUMMARY OF THE INVENTION

It is accordingly an object of the invention to provide a method for fabricating a light-emitting device based on a gallium nitride-based compound semiconductor, and a light-emitting device based on a gallium nitride-based compound semiconductor that overcome the above-mentioned disadvantages of the prior art methods and devices of this general type, which has a further improved light yield.

With the foregoing and other objects in view there is provided, in accordance with the invention, a method for fabricating a light-emitting device. The method includes forming at least one compound semiconductor layer based on gallium nitride and being an active layer or a part of an active layer sequence; and setting growth parameters used during production of the compound semiconductor layer such that, at least in some cases in a vicinity of dislocations in the compound semiconductor layer, regions are produced in the compound semiconductor layer having a lower thickness than remaining regions of the compound semiconductor layer.

The light-emitting device based on a gallium nitride-based compound semiconductor in accordance with the present invention includes a light-emitting layer with a first and a second main surface, and is formed from a compound semiconductor based on gallium nitride. A first coating layer, which is joined to the first main surface of the light-emitting layer, is formed from an n-type compound semiconductor based on gallium nitride. A second coating layer, which is joined to the second main surface of the light-emitting layer, is formed from a p-type compound semiconductor based on gallium nitride. The composition of the compound semiconductor of the light-emitting layer differs from that of the compound semiconductors of the first and second coating layers. The light-emitting layer and the first and second coating layers are formed in succession on a substrate, preferably by a MOCVD process. The light-emitting device according to the present invention is distinguished by the fact that the thickness of the light-emitting layer in the vicinity of dislocations is less than in the remaining regions. In particular on substrates such as sapphire or silicon carbide (SiC), the known compound semiconductors based on gallium nitride have a very high dislocation density.

The reduction in the thickness of the light-emitting layer in the vicinity of dislocations causes shielding energy barriers, which suppress diffusion of charge carriers toward the dislocations and therefore prevent possible non-radiating recombination of electron-hole pairs at these dislocations (passivation of the dislocations), to be built up at the dislocations. Even if it is in part assumed that the dislocations which are present, in the case of compound semiconductors based on gallium nitride, unlike in the case of the compound semiconductors based on gallium phosphide or gallium arsenide, do not act as non-radiating recombination centers, and therefore the density of the dislocations has no significant effects on the light yield of light-emitting devices constructed in this way (see the reference by S. D. Lester et al.: titled "High Dislocation Densities in High Efficiency GaN-Based Light-Emitting Diodes", Appl. Phys. Lett. 66 (1995), pp. 1249-1251 and T. Mukai et al.: "InGaN-Based Blue Light-Emitting Diodes Grown on Epitaxially Laterally Overgrown GaN Substrates", Jpn. J. Appl. Phys., Vol. 37 (1998), pp. L839-L841), with the light-emitting devices according to the present invention it was possible to detect higher light yields than with comparable conventional light-emitting devices. It is therefore assumed that the formation of shielding energy barriers at dislocations has a beneficial effect on the light yield, since the recombination of charge carriers takes place to a greater extent in regions of lower band gaps, i.e. in optically active regions.

The thickness of the light-emitting layer in the vicinity of dislocations is preferably reduced to less than half the thickness of the light-emitting layer in the remaining region.

In a preferred embodiment of the invention, the light-emitting layer is formed from an $In_xAl_yGa_{1-x-y}N$ compound semiconductor, where $0 \leq x \leq 1$, $0 \leq y \leq 1$ and $x+y \leq 1$. The invention can advantageously be used in particular also for In-free light-emitting devices, i.e. for x=0.

The light-emitting layer may be doped with a p-type foreign substance and/or an n-type foreign substance. The light-emitting layer is preferably an intrinsic quantum film of a quantum film structure, preferably of an (preferably intrinsic) InGaN/GaN quantum film structure having at least one GaN quantum film.

The general concept of the invention of reducing the layer thickness in the vicinity of dislocations for the purpose of building up an energy barrier in the vicinity of dislocations in order thereby to increase the quantum yield is particularly preferably applied to In-free radiation-emitting layers.

In accordance with an additional feature of the invention, the first coating layer is formed from a $Ga_uAl_{1-u}N$ compound semiconductor where $0 < u \leq 1$, and the second coating layer is formed from a $Ga_vAl_{1-v}N$ compound semiconductor where $0 < v \leq 1$.

In accordance with a further feature of the invention, a buffer layer is formed on the substrate, and the first coating layer is then formed on the buffer layer. The buffer layer is formed from a $Ga_mAl_{1-m}N$ compound semiconductor where $0 \leq m \leq 1$. The substrate is formed from sapphire, silicon carbide, zinc oxide or gallium nitride.

Other features which are considered as characteristic for the invention are set forth in the appended claims.

Although the invention is illustrated and described herein as embodied in a method for fabricating a light-emitting device based on a gallium nitride-based compound semiconductor, and a light-emitting device based on a gallium nitride-based compound semiconductor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
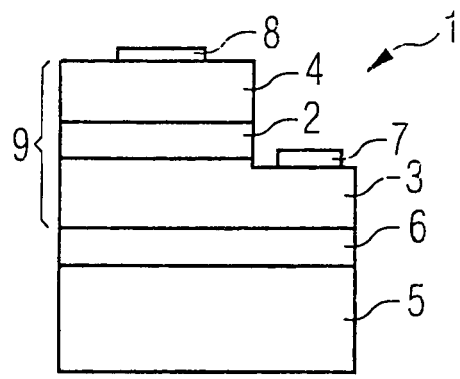
FIG. 1 is a diagrammatic, sectional view of a basic structure of an exemplary embodiment of a light-emitting device according to the invention.

Referring now to the figures of the drawing in detail and first, particularly, to FIG. 1 thereof, there is shown the basic structure of a light-emitting diode 1. However, the invention also encompasses laser diodes as light-emitting devices.

The light-emitting diode 1 has what is known as a double heterostructure 9, containing an active, i.e. light-emitting layer 2, a first n-conducting coating layer 3 and a p-conducting second coating layer 4. The light-emitting layer 2 is formed from an $In_xAl_yGa_{1-x-y}N$ compound semiconductor, where $0 \leq x \leq 1$, $0 \leq y \leq 1$ and $x+y \leq 1$, and also encompasses in particular In-free light-emitting diodes having an $Al_yGa_{1-y}N$ compound semiconductor where $0 < y \leq 1$ (i.e. x=0). The first coating layer 3 is formed from a $Ga_uAl_{1-u}N$ compound semiconductor $0 < u \leq 1$, and the second coating layer 4 is formed from a $Ga_vAl_{1-v}N$ compound semiconductor where $0 < v \leq 1$. The composition of the compound semiconductor in both the first and the second coating layers 3, 4 differs from the composition of the compound semiconductor in the light-emitting layer 2. The compositions of the compound semiconductors in the two coating layers 3 and 4 may in this case be identical to or different than one another.

The light-emitting diode 1 emits ultraviolet light, if x is close to 0, and longer-wave red light, if x is close to 1. In the range $0 < x < 0.5$, the light-emitting diode 1 emits blue to yellow light in the wavelength range from approximately 450 to 550 nm.

In addition to the doping of the first and second coating layers 3 and 4 with n-type and p-type foreign substances, respectively, it is also possible for the light-emitting layer 2 to be doped with n-type foreign substances and/or p-type foreign substances in order to improve the light yield of the light-emitting diode. Examples of p-type foreign substances which can be used include beryllium, magnesium, calcium, zinc, strontium and cadmium from main group II of the periodic system, with zinc or in particular magnesium being preferred for the light-emitting layer 2. Examples of n-type foreign substances that can be used include silicon, germanium and tin from main group IV of the periodic system or sulfur, selenium and tellurium from main group VI of the periodic system.

The first, n-conducting coating layer 3 has a layer thickness of approximately 0.05 to 10 µm, and the second, p-conducting coating layer 4 has a layer thickness of approximately 0.05 µm to 1.5 µm. The layer thickness of the light-emitting layer 2 is preferably in the range from approximately 10 Å to 0.5 µm.

As illustrated in FIG. 1, the double heterostructure 9 is usually formed above a buffer layer 6 on a substrate 5. Examples that can be used for the substrate 6 include sapphire, silicon carbide (SiC) or zinc oxide (ZnO). By way of example, AlN, GaN or $Ga_mAl_{1-m}N$ where $0 < m < 1$ is used for the buffer layer 6 with a layer thickness of approximately 0.002 to 0.5 µm.

Both the buffer layer 6 and the first and second coating layers 3 and 4, as well as the light-emitting layer 2, are preferably applied to the substrate 5 in succession by a metal organic chemical vapor deposition (MOCVD). After the double heterostructure 9 as illustrated in FIG. 1 has been formed, the second coating layer 4 and the light-emitting layer 2 are partially etched away in order to uncover the first coating layer 3, as can be seen in the right-hand half of the light-emitting diode 1 shown in FIG. 1. An n-electrode 7 is formed on the uncovered surface of the first coating layer 3, while a p-electrode 8 is formed on the surface of the second coating layer 4.

At this point, it should be noted that the present invention does not just encompass a light-emitting device with a layer structure as described with reference to FIG. 1. It also covers in particular light-emitting devices which may have further compound semiconductor layers between the buffer layer 6 and the first coating layer 3 and/or above the second coating layer 4, in order to reduce the stresses between the individual junctions of different compound semiconductors.

Figure 3:
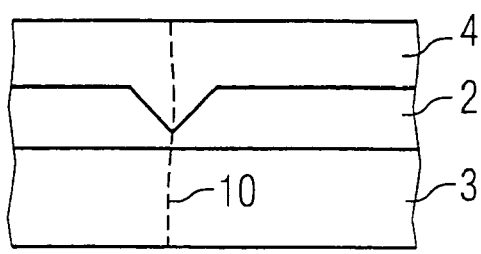
FIG. 3 is a diagrammatic, enlarged excerpt of the light-emitting device shown in FIG. 1.

While the basis of the structure of the light-emitting device 1 as described above with reference to FIG. 1 is already known, the light-emitting device 1 in accordance with the present invention is distinguished by a particular feature that is illustrated in the enlarged excerpt shown in FIG. 3.

As has already been mentioned above, the light-emitting devices based on gallium nitride-based compound semiconductors have very high dislocation densities. Dislocations of this type are formed in particular on account of the different lattice constants of the individual layers 2 to 6 of the devices. FIG. 3 illustrates, by way of example, a dislocation 10 by an approximately vertically running, dashed line which extends through the two coating layers 3 and 4 and the light-emitting layer 2.

As is clearly illustrated in FIG. 3, the thickness of the light-emitting layer 2 is considerably lower in the vicinity of the dislocation 10 than in the remaining region of the light-emitting layer. The thickness of the light-emitting layer 2 in the vicinity of the dislocation 10 is preferably less than half the thickness of the light-emitting layer 2 in the remaining regions. In the example shown in FIG. 3, a layer thickness of approximately 3 nm is selected for the light-emitting layer 2, and in the vicinity of the dislocation 10 the layer thickness is reduced to 1 nm.

Figure 2:
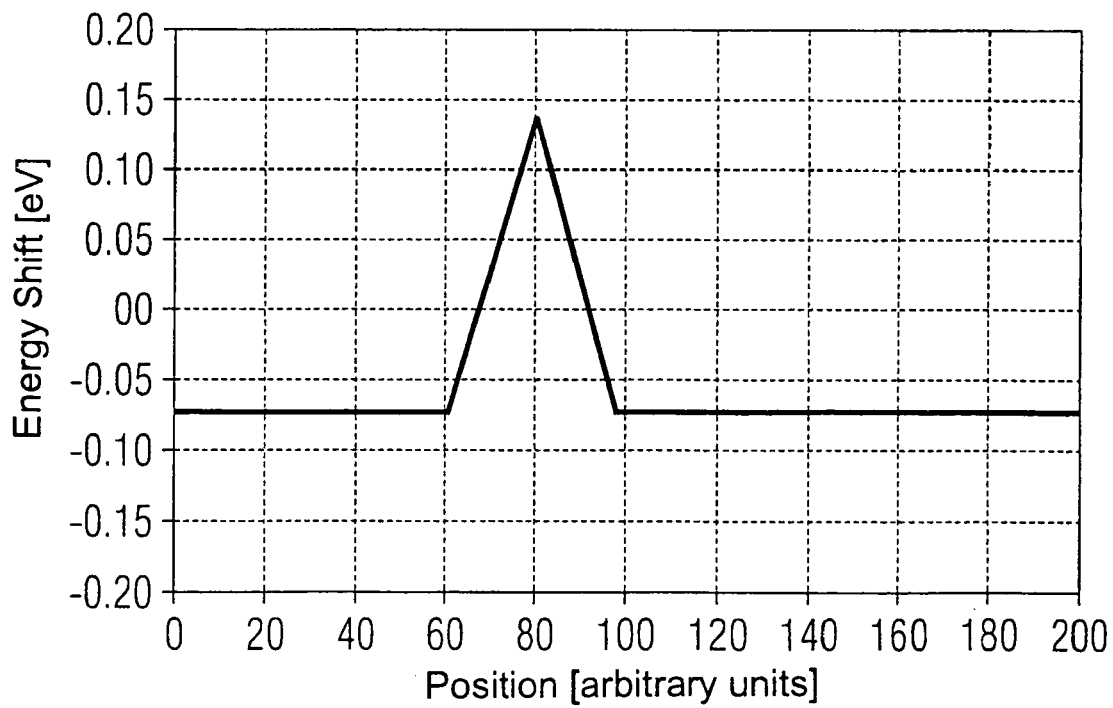
FIG. 2 is a graph of an energy curve of a band gap.

On account of the strong piezoelectric field in the double heterostructure 9, which is caused in particular by the Wurtzite structure of the group III nitrides and the strongly polar nature of the Ga/In/Al-nitrogen bond, the effective band gap is highly dependent on the thickness of the light-emitting layer 2. This energy profile of the band gap over the location is diagrammatically depicted in FIG. 2 above the structure of the double heterostructure 9. In the example illustrated here, at an emission wavelength of 420 nm in the light-emitting layer formed from $In_{0.1}Ga_{0.9}N$, a corresponding energy barrier, which shields the dislocation, is built up by the increase in the effective band gap by 250 meV.

The energy barrier which is built up in this way prevents charge carriers from diffusing into the vicinity of the dislocation 10, with the result that non-radiating recombination of electron-hole pairs at dislocations can be effectively suppressed. The charge carriers are therefore forced to recombine in other regions of the light-emitting layer, preferably in the regions with the lowest band gaps. The diffusion of charge carriers is still effectively precluded even at temperatures above room temperature.

To achieve the above energy barrier, the growth of the light-emitting layer 2 is deliberately controlled during the formation of the double heterostructure 9 on the substrate 5 or the buffer layer 6. As a result of the growth conditions, such as growth temperature, V/III ratio, V/V ratio, growth rate, carrier gas composition, addition of surfactants of various types (e.g. In, Si) and the like, being modified, dislocations 10 which continue from a layer assembly 3, 6 located beneath the light-emitting layer 2 into the region of the light-emitting layer 2 lead to growth changes in the vicinity of such dislocations 10. The growth changes can be recognized, for example, from what are known as V defects, which are a clear indication of reduced growth rates at the location of the defect. In the vicinity of the dislocation 10, the reduced growth rates lead locally to reduced layer thicknesses of the light-emitting layer 2 as described above.

Since the method according to the invention for fabricating a light-emitting device based on a gallium nitride-based compound semiconductor makes it possible to achieve a light-emitting device with an improved light yield, according to the present invention it is advantageously also possible to fabricate In-free devices with a satisfactory light yield.

Previous tests have shown that In-free light-emitting diodes have considerably lower light yields than In-containing light-emitting diodes. Possible causes of this are both lower piezoelectric fields and also different growth mechanisms. In this context, it should be noted that a light-emitting layer 2 of InGaN is usually produced at 700-800° C., while temperatures of over 1,000° C. are required for light-emitting layers 2 made from GaN and AlGaN. If stresses and piezoelectric fields are deliberately incorporated in In-free light-emitting diodes, on the other hand, it is possible, by targeted control of the growth with a view to achieving a smaller thickness of the light-emitting layers 2 in the vicinity of dislocations 10 in accordance with the present invention, to produce a light-emitting diode with a sufficient light yield.

As an alternative to the double heterostructure 9 which has been specifically described in conjunction with FIG. 3, it is preferable to provide a single or multiple InGaN/GaN quantum film structure (preferably intrinsic), in which one or possibly more, preferably intrinsic GaN quantum films are provided as radiation-emitting layers and have the regions of lower thickness according to the invention in the vicinity of dislocations. The above explanation based on the double heterostructure 9 was selected for the sake of simplicity.

We claim:

1. A method for fabricating a light-emitting device, which comprises the steps of:
    forming at least one compound semiconductor layer based on gallium nitride and being an active layer or a part of an active layer sequence, the at least one compound semiconductor layer being a light-emitting layer; and
    setting growth parameters used during production of the compound semiconductor layer such that, at least in some cases in a vicinity of dislocations in the compound semiconductor layer, regions are produced in the compound semiconductor layer having a lower thickness than remaining regions of the compound semiconductor layer;
    wherein said regions with the lower thickness are formed to be less than half as thick as the remaining regions of the compound semiconductor layer in the final structure of the light-emitting device; and
    wherein the light-emitting device is Indium free, and the light-emitting layer comprises $Al_yGa_{1-y}N$, where $0<y<1$.

2. The method according to claim 1, which further comprises:
    providing a substrate;
    forming a first coating layer formed from a compound semiconductor based on gallium nitride of a first conductivity type on the substrate;
    forming the compound semiconductor layer over the first coating layer; and
    forming a second coating layer formed from a compound semiconductor based on gallium nitride of a second conductivity type over the light-emitting layer, a composition of the compound semiconductor layer based on gallium nitride differing from a composition of the compound semiconductor of the first and second coating layers.

3. The method according to claim 1, which further comprises forming the compound semiconductor layer from an $In_xAl_yGa_{1-x-y}N$ compound semiconductor, where $0<x\leq1$, $0\leq y\leq1$ and $x+y\leq1$.

4. The method according to claim 3, which further comprises setting x=0.

5. The method according to claim 2, which further comprises doping the light-emitting layer with a p-type foreign substance and/or an n-type foreign substance.

6. The method according to claim 2, which further comprises forming the first coating layer from a $Ga_uAl_{1-u}N$ compound semiconductor where $0\leq u\leq1$.

7. The method according to claim 2, which further comprises forming the second coating layer from a $Ga_vAl_{1-v}N$ compound semiconductor where $0<v\leq1$.

8. The method according to claim 2, which further comprises forming the first coating layer, the compound semiconductor layer and the second coating layer in succession on the substrate using a metal organic chemical vapor deposition process.

9. The method according to claim 2, which further comprises forming a buffer layer on the substrate, and the first coating layer is then formed on the buffer layer.

10. The method according to claim 9, which further comprises forming the buffer layer from a $Ga_mAl_{1-m}N$ compound semiconductor where $0\leq m\leq1$.

11. The method according to claim 2, which further comprises forming the substrate from a material selected from the group consisting of sapphire, silicon carbide, zinc oxide and gallium nitride.

12. The method according to claim 1, which further comprises forming the active layer sequence with a quantum film structure.

13. The method according to claim 12, which further comprises forming the quantum film structure to include at least one GaN quantum film.

14. The method according to claim 13, which further comprises forming the quantum film structure as an InGaN/GaN quantum film structure.

15. The method according to claim 12, which further comprises forming the quantum film structure with at least one undoped GaN quantum film.

16. The method according to claim 12, which further comprises forming the compound semiconductor layer with a GaN quantum film or with an intrinsic GaN quantum film.

17. The method according to claim 12, wherein forming the at least one compound semiconductor layer includes forming the active layer or a part of the active layer sequence of the light emitting device.

18. A method for fabricating a light-emitting device, which comprises the steps of:
    forming at least one compound semiconductor light-emitting layer based on gallium nitride and being an active layer or a part of an active layer sequence, the at least one compound semiconductor layer being a light-emitting layer; and
    setting growth parameters used during production of the compound semiconductor layer such that, at least in some cases in a vicinity of dislocations in the compound semiconductor layer, regions are produced in the compound semiconductor layer having a lower thickness than remaining regions of the compound semiconductor layer;
    wherein said regions with the lower thickness are formed to produce shielding energy barriers, which suppress diffusion of charge carriers toward the dislocations and prevent non-radiating recombination of electron-hole pairs at the dislocations;
    wherein said regions with the lower thickness are less than half as thick as the remaining regions of the compound semiconductor layer in the final structure of the light-emitting device; and
    wherein the light-emitting device is Indium free, and the light-emitting layer comprises $Al_yGa_{1-y}N$, where $0<y\leq1$.

* * * * *

UNITED STATES PATENT AND TRADEMARK OFFICE
CERTIFICATE OF CORRECTION

PATENT NO. : 7,482,181 B2
APPLICATION NO. : 10/762097
DATED : January 27, 2009
INVENTOR(S) : Berthold Hahn et al.

It is certified that error appears in the above-identified patent and that said Letters Patent is hereby corrected as shown below:

Claim 1 at column 6, lines 38-57 should be corrected to read as follows:

--1. A method for fabricating a light-emitting device, which comprises the steps of:

forming at least one compound semiconductor layer based on gallium nitride and being an active layer or a part of an active layer sequence, the at least one compound semiconductor layer being a light-emitting layer; and setting growth parameters used during production of the compound semiconductor layer such that, at least in some cases in a vicinity of dislocations in the compound semiconductor layer, regions are produced in the compound semiconductor layer having a lower thickness than remaining regions of the compound semiconductor layer;

wherein said regions with the lower thickness are formed to be less than half as thick as the remaining regions of the compound semiconductor layer in the final structure of the light-emitting device; and wherein the light-emitting device is Indium free, and the light-emitting layer comprises $Al_yGa_{1-y}N$, where $\underline{0 < y \leq 1}$ [[$0 < y < 1$]].--

Claim 3 at column 7, lines 6-9 should be corrected to read as follows:

--3. The method according to claim 1, which further comprises forming the compound semiconductor layer from an $In_xAl_yGa_{1-x-y}N$ compound semiconductor, where $\underline{0 \leq x \leq 1}$ [[$0 < x \leq 1$]], $0 \leq y \leq 1$ and $x + y \leq 1$.--

Claim 6 at column 7, lines 15-17 should be corrected to read as follows:

--6. The method according to claim 2, which further comprises forming the first coating layer from a $Ga_uAl_{1-u}N$ compound semiconductor where $\underline{0 < u \leq 1}$ [[$0 \leq u \leq 1$]].--

Signed and Sealed this
Twenty-fourth Day of April, 2012

David J. Kappos
*Director of the United States Patent and Trademark Office*